United States Patent
Majerus et al.

(10) Patent No.: US 7,265,534 B2
(45) Date of Patent: Sep. 4, 2007

(54) TEST SYSTEM FOR DEVICE CHARACTERIZATION

(75) Inventors: Michael E. Majerus, Chandler, AZ (US); William P. Knappenberger, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 191 days.

(21) Appl. No.: 10/969,426

(22) Filed: Oct. 20, 2004

(65) Prior Publication Data

US 2006/0082378 A1    Apr. 20, 2006

(51) Int. Cl.
    *G01R 31/28* (2006.01)
(52) U.S. Cl. .................................. 324/158.1
(58) Field of Classification Search ............ None
    See application file for complete search history.

(56) References Cited

U.S. PATENT DOCUMENTS

| | | | |
|---|---|---|---|
| 4,746,861 A * | 5/1988 | Nesbitt ...................... 324/761 |
| 4,963,824 A * | 10/1990 | Hsieh et al. ................. 324/763 |
| 5,038,100 A | 8/1991 | Kushner et al. |
| 5,268,637 A * | 12/1993 | Liken et al. ............. 324/158.1 |
| 5,506,513 A | 4/1996 | Bacher |
| 5,642,056 A * | 6/1997 | Nakajima et al. ........... 324/758 |
| 5,894,225 A * | 4/1999 | Coffin ........................ 324/762 |
| 5,994,894 A * | 11/1999 | Fujita ...................... 324/158.1 |
| 6,414,563 B1 | 7/2002 | Tsironis |
| 6,558,169 B2 * | 5/2003 | Figueroa et al. .............. 439/70 |
| 6,933,736 B2 * | 8/2005 | Kobayashi et al. ......... 324/754 |
| 2005/0014395 A1* | 1/2005 | Fjelstad et al. ............... 439/61 |
| 2006/0006859 A1* | 1/2006 | Watanabe ................ 324/158.1 |

OTHER PUBLICATIONS

"Transistor Test Fixture MT950 Series," Maury Microwave, Precison Measurement Equipment, http://www.maurymw.com/products/RFDCS/LoadPull/atsprods/MT950_Series.A/MT950_SeriesA.htm, Sep. 2003, pp. 77-79.
"Adjustable Test Fixture Mainframes," Inter-Continental Microwave, http://.icmicrowave.com/Adjustable_Mainframe_TF/Adjustable_Test_Mainframes.htm, Sep. 2003, 2 pgs.

* cited by examiner

*Primary Examiner*—Ha Tran Nguyen
*Assistant Examiner*—Richard Isla-Rodas
(74) *Attorney, Agent, or Firm*—David G. Dolezal (57) ABSTRACT

Device characterization performed with a test system including a fixture and multiple frequency dependent test boards. In one embodiment, testing is performed with multiple sets of input and output test boards wherein each set is frequency dependent at different frequencies. In some examples, the test board includes an impedance transformer that is a quarter wave length of the fundamental frequency ($f_o$) of a frequency of which the board is dependent. In some examples, S-parameters and load pull measurements are obtained for the device under test with the test boards at different frequencies.

30 Claims, 8 Drawing Sheets

TEST SYSTEM FOR DEVICE CHARACTERIZATION

BACKGROUND OF THE INVENTION

1. Field of the Invention

This invention relates in general to testing systems for electronic device characterization.

2. Description of the Related Art

Testing systems include fixtures for performing tests for electronic device characterization. Such a device characterization can be used to design and build integrated circuits with the device.

Some previous test systems utilized fixtures with DC bias circuitry and frequency specific circuitry for a particular frequency built on the fixture between external connectors. A carrier with a package could then be attached to the fixture. Examples of such systems include the MAURY MICROWAVE MT950 sold by the MAURY CORP. One problem with such systems is that the circuitry coupling the external connections to the device under test can not be varied with respect to the different frequencies. Accordingly, such a fixture can not be used to perform device characterizations that are optimized at different frequencies.

What is needed is a test system that allows for optimal testing of a device over a specific range of frequencies.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
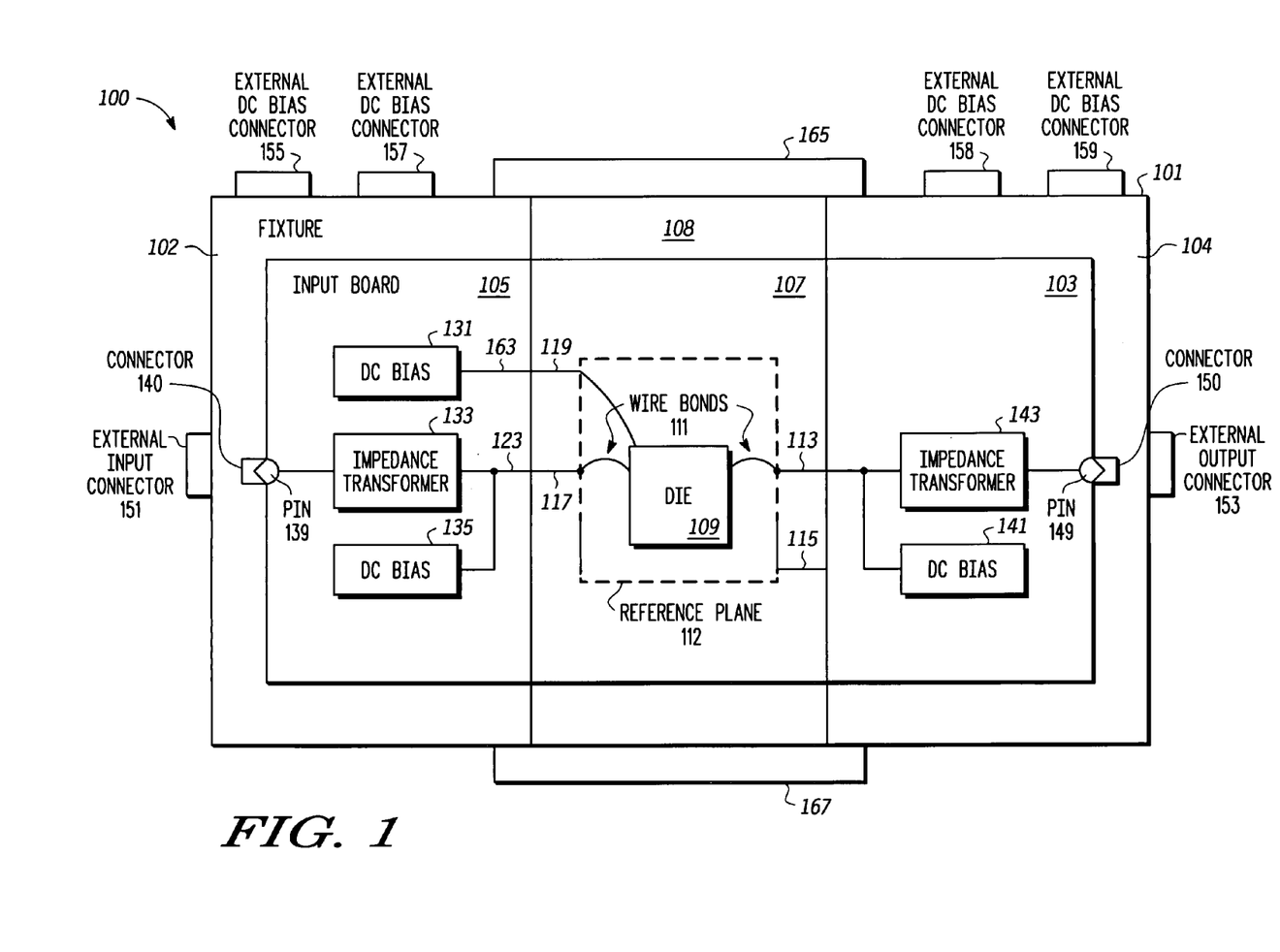
FIG. 1 is a top view of one embodiment of a test system according to the present invention.

FIG. 1 is a top view of a test system 100 for measuring characteristics (e.g. RF characteristics) of a device under test. In the embodiment shown, the device under test is implemented in semiconductor die 109, but may be in other configurations in other embodiments. In one embodiment, die 109 includes an RF device such as e.g. a 7200 micron squared Hetro-Junction Bipolar transistor, but may include other RF devices in other embodiments such as e.g. Emode, GaAsfet, pHempt, Silicon HBT, and RF-CMOS transistors.

Die 109 is attached to a carrier 107. Carrier 107 includes signal traces 117, 113, 115, and 119, which in one embodiment are metal traces on a ceramic substrate. Carrier 107 is removably attached (e.g. with screws) to a carrier midsection 108 of test system 100.

System 100 includes a fixture 101. Fixture 101 includes an input fixture half 102 and an output fixture half 104. Carrier midsection 108 is removable from half 102 and half 104. Fixture 101 includes set screws 165 and 167 for moving half 102 and half 104 with respect to each other. Halves 102 and 104 are moved with respect to each other for installing midsection 108 and other midsections in Fixture 101. Other midsections (not shown) that may be installed in fixture 101 include other types of circuits such as e.g. calibration standards. A calibration standard is a test circuit of known electrical characteristics, which can be used during calibration routines e.g. for determining systematic errors of a test system.

Fixture 101 includes external DC bias connectors 155, 157, 158, and 159 for providing DC biases to die 109 from external DC sources (not shown). Half 102 includes an external input connector 151 for receiving a test RF signal from an RF signal source (e.g. RF signal generator or network analyzer). Half 104 includes an external output connector 153 for providing an output signal from fixture 101 to an RF receiver for measuring data for device characterization.

System 100 includes a input board 105 that is removable from fixture 101. Input board provides a frequency dependent interface to die 109 from external input connector 151. Board 105 includes an impedance transformer 133 that transforms the impedance of the RF signal path from connector 151 to carrier 107 from a high impedance value (e.g. 50 ohms) to a low impedance values (e.g. 5 ohms). In the embodiment shown, the board is frequency dependent at a frequency in that the impedance transformer is a quarter wave length of the fundamental frequency (f0) of the frequency of which the board is dependent. In other embodiments, a board may be frequency dependent at a frequency utilizing other types of circuitry such as a Chebyshev step transformer or lumped element transformer, e.g. where the frequency is located in the passband. In other embodiments, a board is frequency dependent at a frequency if the board includes structures for optimizing the impendence performance of the board for the frequency.

In one embodiment, providing a system with removable boards with frequency dependent circuitry may allow for the testing of die 109 at different frequencies using the same fixture.

The amount that the impedance is reduced by transformer 133 may be dependent in some embodiments on the size of the device under test. For example, in some embodiments, a 7200 micron Hetro-Junction Bipolar (HBT) may have impedances of 2-3 ohms. Accordingly, impedance transformer 133 would be sized to reduce the impedance from 50 ohms to the impedance of the device under test. Utilizing a quarter wave transformer at the fundamental frequency allows an impedance match the device for maximum power transfer, thereby allowing for a more accurate characterization.

Board 105 includes DC bias circuits 131 and 135 with each including a low pass filter. Board 105 also includes a pin 139 for mating with connector 140 of half 102. Details of connector 140 will be illustrated in FIGS. 4 and 5.

System 100 also includes an output board 103 that is removable from fixture 101. Output board 103 provides a frequency dependent interface from die 109 to external output connector 153. Board 103 includes an impedance transformer 143 that transforms the impedance of the RF signal path from carrier 107 to connector 153 from a low impedance value (e.g. 5 ohms) to a high impedance value (e.g. 50 ohms). In one embodiment, the board is frequency dependent in that the impedance transformer is a quarter wave length of the fundamental frequency ($f_0$) of the frequency of which the board is dependent.

Board 103 also includes a DC bias circuit 141 which includes a low pas filter coupled to DC bias external connector 159. Board 103 also includes a pin 149 for mating with connector 153.

Figure 2:
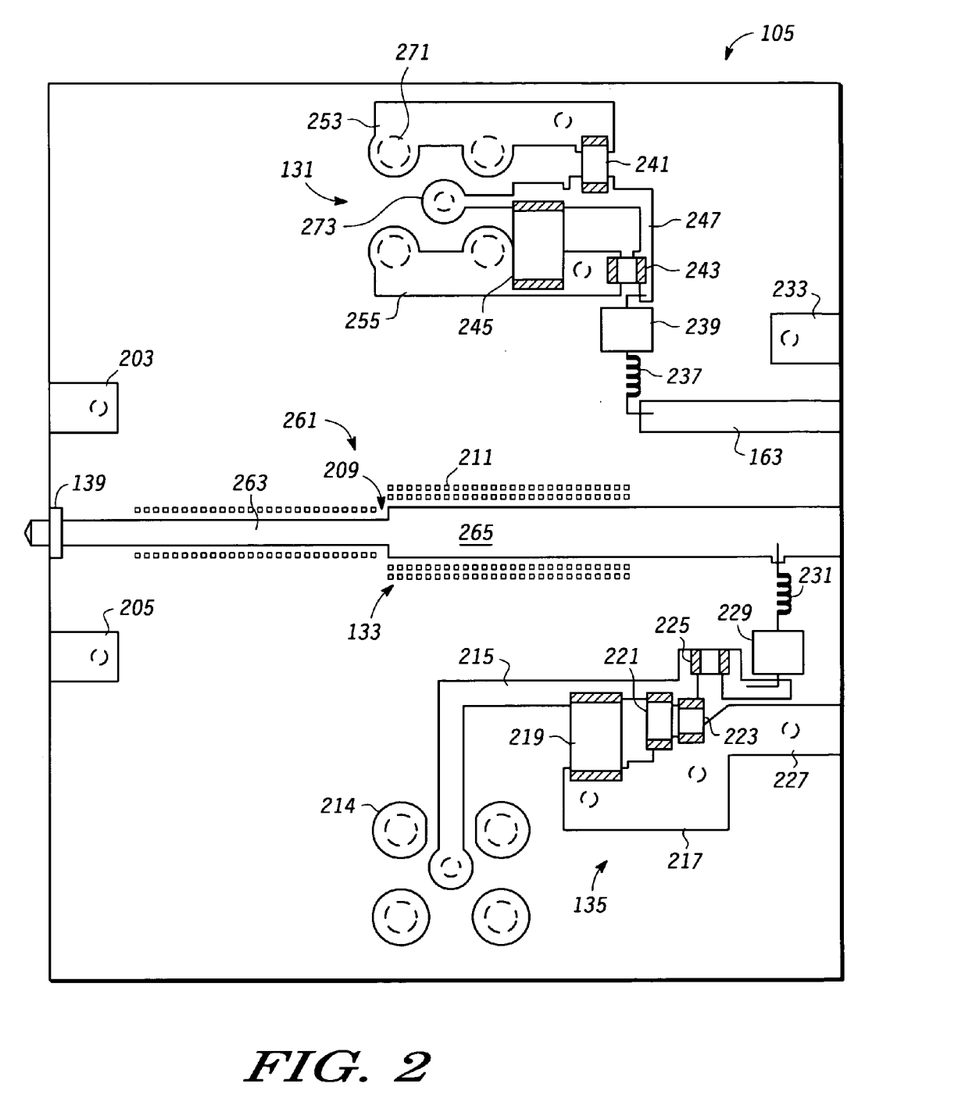
FIG. 2 is a top view of one embodiment of an input test board according to the present invention.

FIG. 2 shows a top view of input board 105. In the embodiment shown, impedance transformer 133 is implemented as location 209 where the width of the trace 261 changes from a narrow width (the width of trace portion 263) to a wider width (the width of trace portion 265) to provide a reduced impedance. The length of trace 261 and the widths of portions 263 and 265 are sized (along with trace 117) to provide a quarter wave transformer at the fundamental frequency on which the board is dependent. In one embodiment, the fundamental frequency is 900 MHz, but may be other frequencies in other embodiments.

Transformer 133 also includes tuning stub structures (e.g. 211) located adjacent to portions 263 and 265. These structures allow for the fine tuning of transformer 133 after the construction of the board. To finely tune transformer 133, a ribbon is soldered to a particular stub structure at specific locations to implement a tuning stub for tuning board 105. For embodiments wherein no tuning is needed, no stub structure would be soldered to trace 261.

DC bias circuit 131 includes ground traces 253 and 255. Each ground trace is connected to plated through holes (e.g. 271) extending though board 105 to ground pads (not shown in FIG. 2) located on the bottom side of board 105. The ground pads on the bottom side of board 105 contact ground pads on half 102 (not shown) that are coupled to the ground conductor of external DC bias connector 155 (see FIG. 1). Circuit 131 includes a power trace 273 that is coupled via a plated through hole to a pad (not shown) on the opposite side of board 105 that contacts a power pad (not shown) of half 102. The power pad of half 102 is coupled to the power conductor of connector 155.

Circuit 131 includes capacitors 241, 243, and 245, along with ferrite bead 239 and inductor 237 to provide a low pass filter for the DC bias voltage. The filtered DC bias voltage is provided to carrier 107 via trace 163. When board 105 and carrier 107 are installed in fixture 101, trace 163 contacts trace 119 (see FIG. 1) to provide a filtered DC bias to die 109.

Circuit 135 includes a power trace 215 which is coupled to the power connector of DC bias connector 157 when board 105 is installed in half 102. The DC bias voltage provided on trace 215 is filtered by a low pass filter that includes capacitors 219, 221, 223, resistor 225, ferrite bead 229, and inductor 231. Circuit 135 also includes ground plane 217 which is coupled to system ground via plated through holes (e.g. 227). Circuit 135 also includes four pads (e.g. 214) each coupled to the ground conductors of the DC bias conductor 157 and system ground when board 105 is installed in fixture half 102.

Inductor 231 is coupled to trace portion 265 to apply a filtered DC bias to the RF input to carrier 107. In other embodiments, trace 261 would be biased from DC bias circuit 131. Trace portion 265 contacts trace 117 of carrier 107 when board 105 and carrier 107 are installed in fixture 101.

Board 105 also includes a ground trace 233 that wraps around the end of board 105 to provide a ground path for midsection 108. Ground trace 233 is coupled to system ground via a plated through hole and ground pad on the back side of board 105. The ground pad on the back side of board 105 contacts half 102, which is made of a conductive material and is grounded. Board 105 also includes two ground tabs 203 and 205 that wrap around the edge of board 105. When board 105 is inserted into fixture 101, ground tabs 203 and 205 contact the side of fixture half 102 to provide an additional ground path for board 105.

Portion 263 is connected to pin 139 which is located on the top side of board 105.

Figure 3:
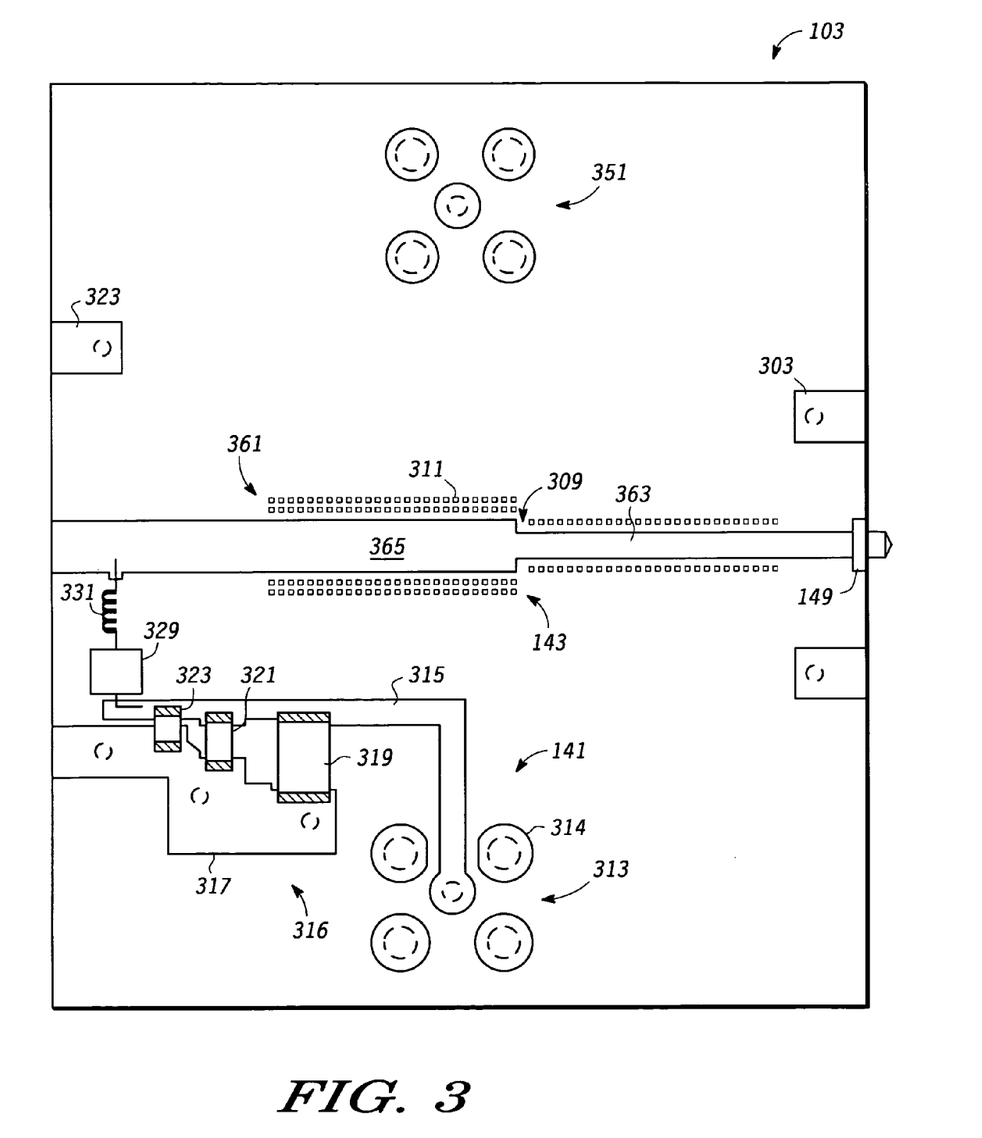
FIG. 3 is a top view of one embodiment of an output test board according to the present invention.

FIG. 3 is a top view of output board 103. In the embodiment shown, impedance transformer 143 is implemented as location 309 where the width of the trace 361 changes to a narrow width (the width of trace portion 363) from a wider width (the width of trace portion 365) to provide a reduced impedance. The length of trace 361 and the widths of portions 363 and 365 are sized (along with trace 113) to provide a quarter wave transformer at the fundamental frequency on which the board is dependent. Transformer 143 also includes tuning stub structures (e.g. 311) located adjacent to portions 363 and 365 for the fine tuning of transformer 143.

DC bias circuit 141 includes a power trace 315 which is coupled to the power connector of external DC bias connector 159 when board 103 is installed in half 104. The DC bias voltage provided on trace 315 is filtered by a low pass filter that includes capacitors 319, 321, 323, ferrite bead 329, and inductor 331. Circuit 141 also includes ground plane 317 which is coupled to system ground via through plated holes when board 103 is installed in half 104. Circuit 141 also includes four pads (e.g. 314) each coupled to the ground conductor of the DC bias conductor 159 and system ground when board 103 is installed in fixture half 104.

Inductor 331 is coupled to trace portion 365 to apply a filtered DC bias to the RF output of carrier 107. Trace portion 365 contacts trace 113 of carrier 107 when board 103 and carrier 107 are installed in fixture 101.

In other embodiments, the output test board (e.g. 103) may include another DC bias circuit located on the top half of the board and having conductive traces coupled to DC bias external connector 158 when the board is installed in half 104.

Figure 4:
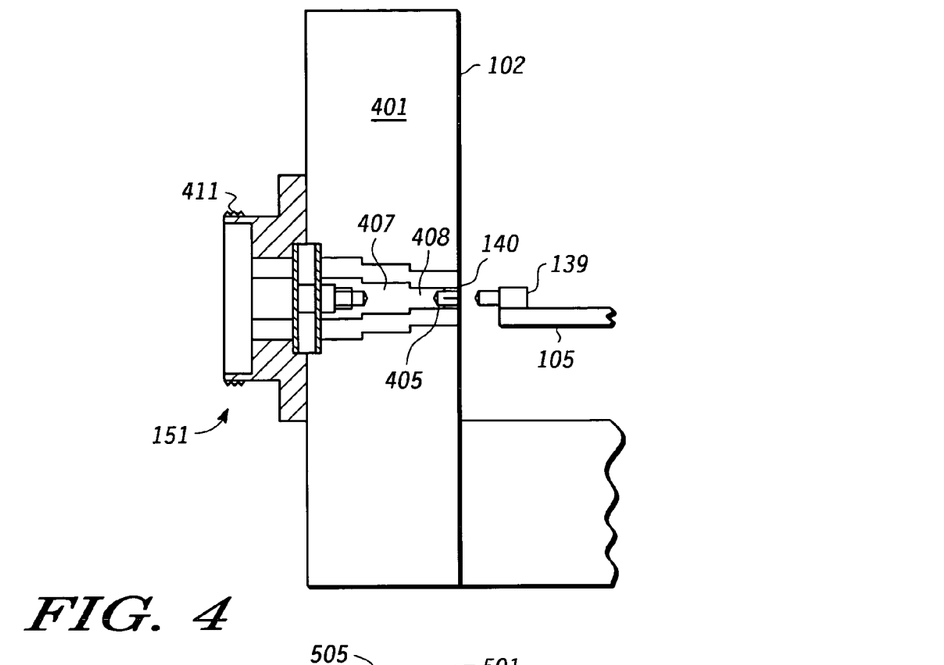
FIG. 4 is a partial cutaway side view of one embodiment of a fixture showing an external connector according to the present invention.

FIG. 4 shows a partial side cutaway view of half 102. External input RF connector 151 is shown mounted in sidewall 401 of half 102. Connector 151 includes threads 411 from mating with threads of an RF cable (not shown) for providing an input RF signal. Connector 151 includes an interior conductive portions 407 and 408 that carry the RF signal to connector 140 which is located on portion 408 and includes an opening for receiving a pin (e.g. 139) from an input board (e.g. 105) when a board is installed in fixture half 102.

Figure 5:
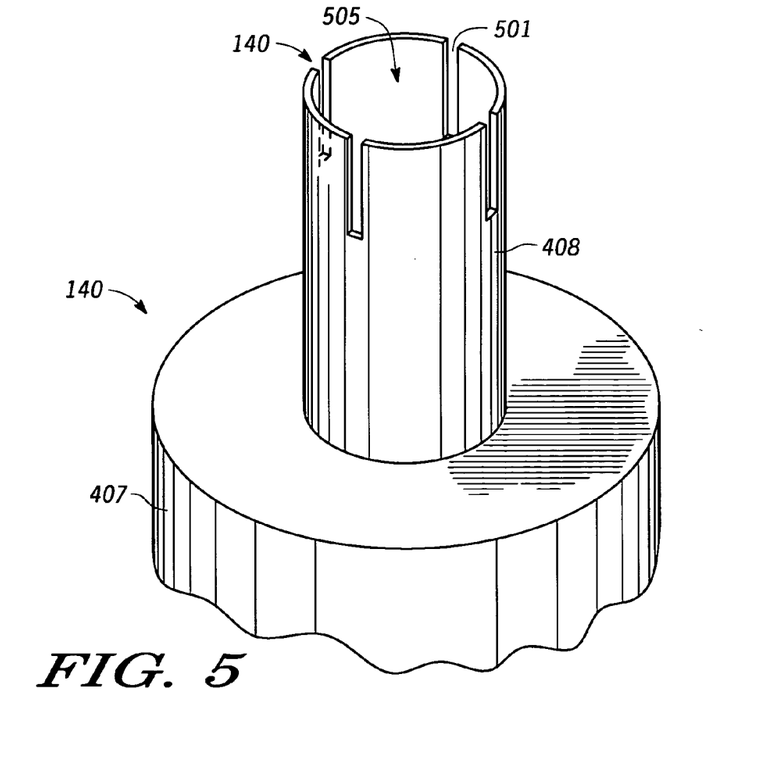
FIG. 5 is a partial expanded view of one embodiment of a connector according to the present invention.

FIG. 5 shows an expanded view of connector 140. Connector 140 includes an opening 505 in portion 408. Slots (e.g. 501) are included in the walls of portion 408. These slots enable connector 140 to provide a force on a connector pin (e.g. 139) of a test board so as to provide a good electrical connection for receiving or providing an RF signal to a removable test board.

In one embodiment, boards 105 and 103 snap fit into halves 102 and 104 respectively. In other embodiments, these boards may be coupled by other mechanisms (e.g. screws).

Figure 6:
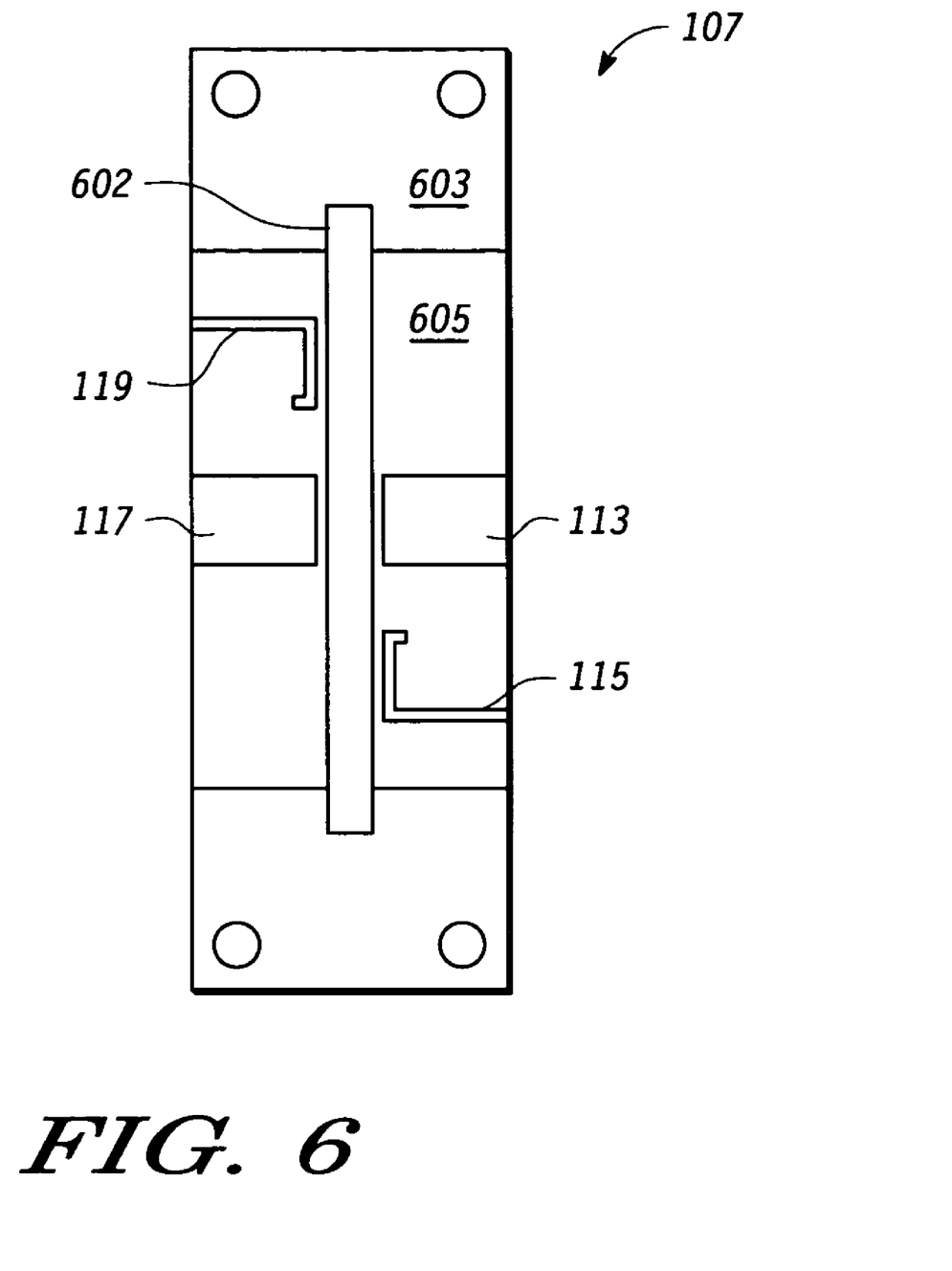
FIG. 6 is a top view of one embodiment of a device carrier assembly according to the present invention.

FIG. 6 is a top view of one embodiment of device carrier 107. In the embodiment shown, device includes a conductive pedestal 602 wherein a device under test (not shown) is attached. In the embodiment shown, carrier 107 includes a dielectric board 605 with electrically conductive traces 119, 117, 113, and 115 (e.g. copper) located thereon. In one embodiment, the external connectors (e.g. bond pads) of a die under test would be wire bonded (e.g. with wire bonds 111 of FIG. 1) to the traces of carrier 107. Carrier 107 includes conductive end plates 603.

Figure 7:
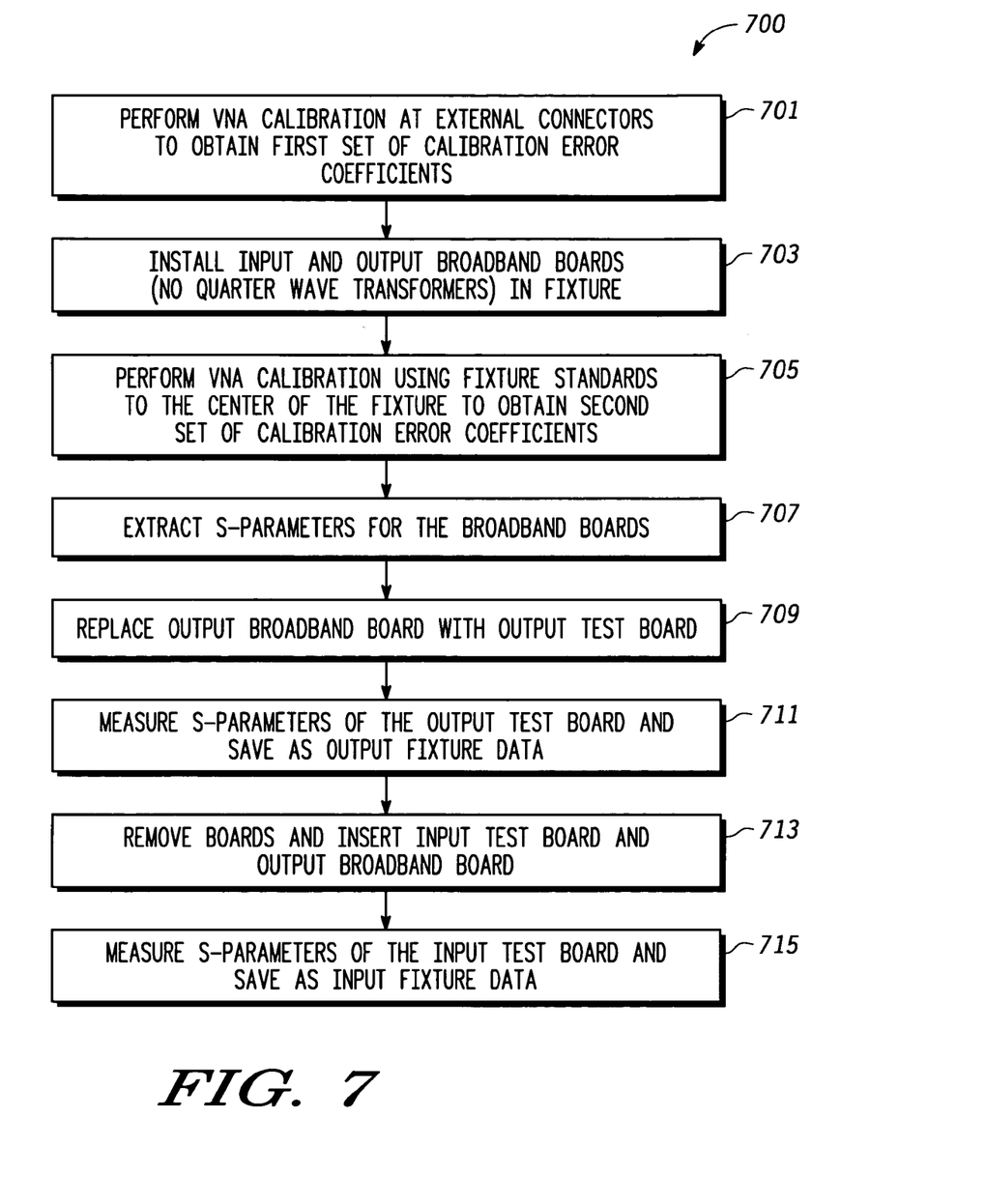
FIG. 7 is a flow diagram of one embodiment of a calibration routine for calibrating a test system to a device reference plane according to the present invention.

FIG. 7 is a flow diagram of one embodiment of a process for determining the characteristics of test system 100 including input test board 105 and output test board 103. Determining the characteristics of system 100 allows for the removal of those characteristics from test results of a device under test thereby allowing for the movement of the reference plane to the wire bonds of the device under test. Accordingly, with the parasitics of the test system measured and accounted for, a more accurate representation of the characteristics of the device under test may be obtained.

In 701, vector network analyzer calibration is performed at the external connectors (not shown) of the network analyzer to obtain a first set of calibration error coefficients. In one embodiment, a network analyzer sold by HEWLETT PACKARD under the trade designation of 8510C is utilized, but other types of network analyzers may be utilized in other embodiments.

In 703, input and output broadband boards (e.g. boards with no quarter wave transformers or other impedance transformers) are installed into fixture 101. In one embodiment, the broadband boards include pins (e.g. similar to pin 139) that are inserted into the connectors (e.g. 140) of the respective fixture halves (e.g. 102 and 104).

In 705 vector network analyzer calibration is performed using different fixture standards to obtain a second set of calibration error coefficients. These fixture standards are located on carriers (not shown) attached to midsections that are individually installed into fixture 101 between fixture half 102 and fixture half 104. Examples of fixture standards include a zero length through, a short, a high frequency line, and a low frequency line. A Through Reflect Line calibration is performed with each fixture in one embodiment, but in other embodiments, other types of VNA calibrations may be performed such as Line Reflect Reflect Match (LRRM) calibration.

In 707 the S parameters for the broadband input board and broadband output board are extracted from the difference of the first set and the second set of calibration error coefficients. In 709, the output broad band board is replaced with the output test board (e.g. 103).

In 711, S-Parameters of the output test board are measured and saved as output fixture data. In one embodiment, S-parameters of the output test board are measured by deembedding the broadband input board with a zero length though located on a midsection installed in fixture 101. With this procedure, the reference plane is moved to the center of the zero length through. Accordingly, the measured S-parameters are the S-parameters of the output test board.

In 713, the broad band input board and the output test board (e.g. 103) are removed and the input test board (e.g. 105) and output broad band board are installed in Fixture 101.

In 715, S-Parameters of the input test board are measured and saved as input fixture data. In one embodiment, S-parameters of the input test board are measured by deembedding the broadband output board with a zero length though on a midsection installed in fixture 101. With this procedure, the reference plane is moved to the center of the zero length through. Accordingly, the measured S-parameters are the S-parameters of the input test board.

Accordingly with the procedure of FIG. 7, the S-parameters of the input test board and the output test board are known. These parameters can be used to removed the parasitic of the test boards from measurements made with the system including a device under test.

For characterizations using a number of different sets of input and output test boards, with each set dependent at a different frequency, the procedures shown in FIG. 7 would be performed on each set to obtain the S-Parameters for each board of the set.

Figure 8:
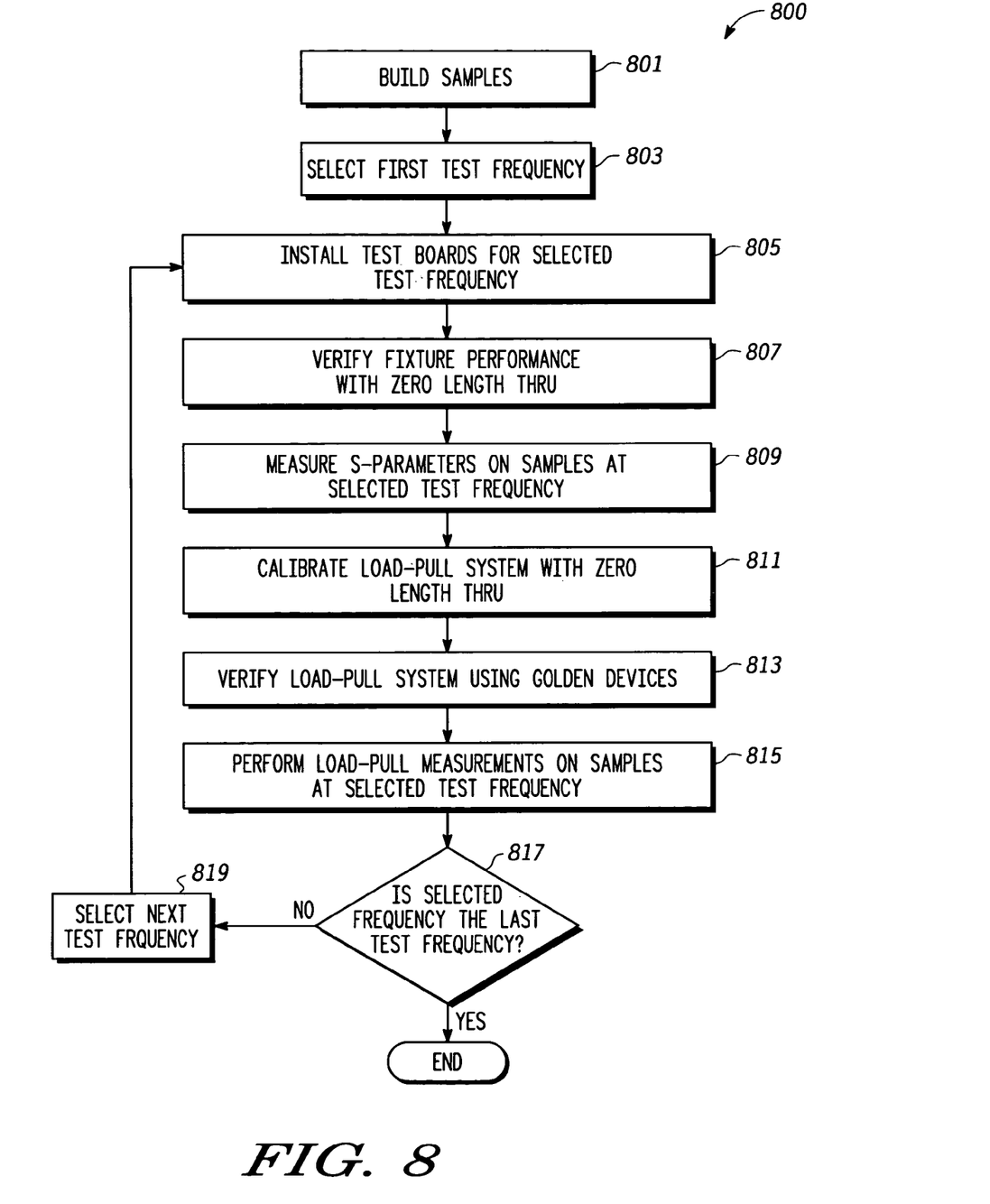
FIG. 8 is a flow diagram of one embodiment of a test procedure for testing a device using a test system over multiple frequencies according to the present invention.

FIG. 8 is a flow chart for measuring RF characteristics of a device under test with system 100 over a range of frequencies. In 801, a sample with a device to be tested is built e.g. on a semiconductor die and attach to a carrier (e.g. 107 of FIG. 6). The flow chart of FIG. 8 shows a process for measuring the RF characteristics of the device of that sample.

In some embodiments, multiple samples, each with a device having the same design would be built. With multiple samples, a range of data may be generated for the device design.

In 803, a first frequency is selected at which the device is to be tested. In 805, the test boards (e.g. input board 105 and output board 103) for the selected frequency are installed in system 100. In one embodiment, the test boards each include a quarter wave transformer at the fundamental frequency of the selected frequency.

In 807, fixture system performance is verified with a zero length through installed in system 100. In one embodiment, a network analyzer is first calibrated at the ends of the analyzer connectors. A zero length through standard is installed in system 100 with the test boards where S-Parameters are measured and a loss is derived there from. This loss is compared with the derived loss of the two test boards e.g. as determined in the procedure of FIG. 7. The loss values should be within a specific tolerance (e.g. 0.1 dB), else system recalibration is needed (e.g. a repeat of the process of FIG. 7 for the test boards of a particular frequency).

In 809, a sample with the device under test is installed in fixture 101 and the S-parameters of the system are measured at the selected frequency. The S-parameters of the input test board and the output test board (as measured in the procedure of FIG. 7) are removed from the measured S-parameters to derive the S-parameters of the device under test at the selected frequency.

In 811, the sample with the device under test is removed from the system and replaced with a zero length through. A load pull system (not shown) is coupled to system 100 wherein the load pull system is then power calibrated. In one embodiment, the load pull system is implemented with an automated tuner sold by the MAURY MICROWAVE CORP under the trade designation of ATS.

In 813, the load pull system is verified using golden devices installed in system 100. Golden devices are specific devices with known RF characteristics. The golden devices are installed in midsections which are removed and inserted into fixture 101 for testing. The load pull system is verified by making power measurements with the load pull system with each golden device, and then comparing those measurements with the known characteristics.

In 815, load pull measurements of the sample are made at the selected frequency. In one embodiment, the load pull measurements are made using a fixed output power algorithm. In one example of this algorithm, the load pull system is programmed to provide a specific input power range to be generated at the input of system 100 (with the midsection including the device under test installed in fixture 101) in order to find the input power value that provides a specified output power level at the output of system 100. The load and source tuner points are set to the conjugate match of the S-parameters derived in 809. A constellation of load points (impedance points) of the tuner on a load plane is specified, and then a load pull is performed using the constellation of load points at the selected frequency. Accordingly, the operability characteristics of the device under test can be evaluated for different impedances at the selected frequency. These measurements also provide lot split information for the device under test.

In other embodiments, other types of load pull measurements may be made including measurements made using variable input power algorithms and measurements made using various power modulation schemes such Code Division Multiple Access (CDMA), Wide-band CDMA, IEEE 802.XX, EDGE, Bluetooth and/or GSM modulation schemes.

In 817, if the device has not been tested at all test frequencies, the next test frequency is selected wherein steps 805, 807, 809, 811, 813, and 815 are perform for the next frequency. Testing is performed until the device as been tested at all test frequencies.

In one embodiment, testing is performed at frequencies of 837 MHz, 850 MHz, 900 MHz, 950 MHz, 1700 MHz, 1800 MHz, 1900 MHz, 2100 MHz, 2600 MHz, 3500 MHz, and 5700 MHz. However, measurements may be made at other frequencies in other embodiments. Accordingly, with some embodiments, input and output boards dependent upon each frequency would be used during such testing.

Using the method shown in FIG. 8, data may be derived about a device under test that may be useful in building an integrated circuit with the device design. For example, contour files of various parameters (e.g. output power, efficiency, gain) over a range of load points can be generated for a device design. Also power sweep files can be generated for a device, wherein the power sweep files include parameter information for a device over a range of power levels.

Providing a system that includes removable test boards (each at different frequencies) may allow for a reduction in time in obtaining the information of a device design. With such a system, a device design can be made and tested over multiple frequencies. In addition, the ability to change out the boards may allow for these measurements to be made in a time efficient manner at different frequencies.

Figure 9:
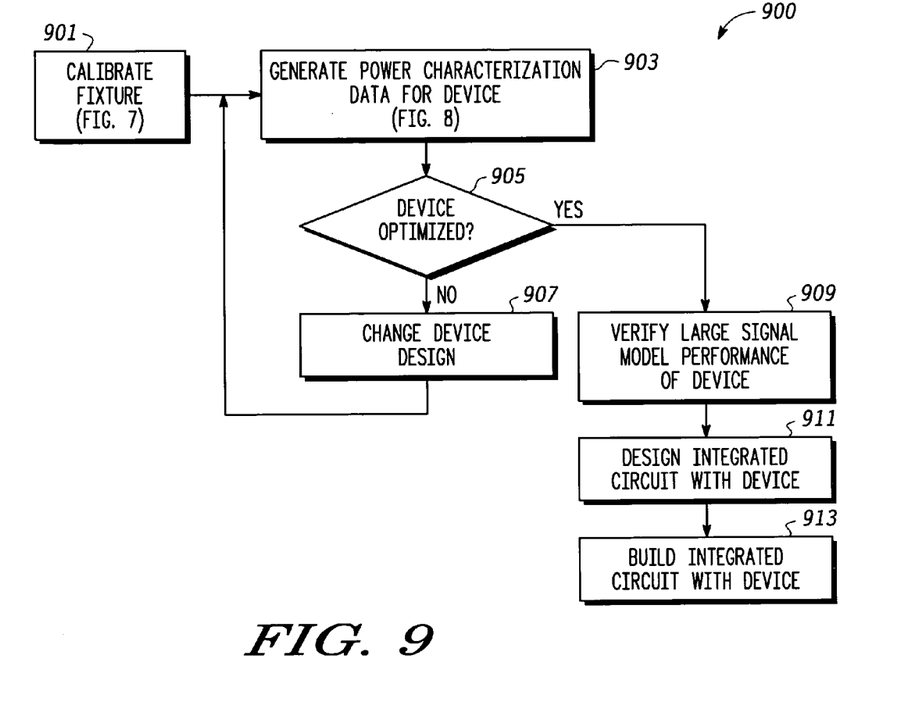
FIG. 9 is a flow diagram of one embodiment for designing and building an integrated circuit using characteristics generated with the procedures of the flow of FIG. 8 according to the present invention.

FIG. 9 is a flow diagram showing one embodiment of how a device can be designed and built in an integrated circuit with data obtained using system 100. In 901, the system is calibrated as with the process set forth in FIG. 7. In 903, samples including the devices built per a device design are made and power characterization data for the device design are generated from measurements made with those samples (see the steps of FIG. 8).

In 905, from the data generated in 903, a determination is made as to whether the device design is optimized. In one embodiment, a device design is optimized if the EPI (epitaxial layer) is optimal for the application, if the manifold feed structure is optimal, and/or if the finger to finger pitches are correct. If any of these parameters is determined not be optimal, the device design may be changed in 907 wherein power characterization data is generated in 903 for the new design.

If in 905, the device design is determined to be optimized, then in 909 the large signal model performance of the device design is verified with the data generated in 903. In one embodiment, the large signal model performance is obtained with a computer simulation of a circuit with the device design and compared to the data generated in 903.

If the model performance in verified in 909, the device design is certified for release to be used in the design of an integrated circuit. In 911, a circuit is designed is with the device design and built in 913.

In other embodiments, other data may be measured and obtained with test system 100. Also with other embodiments, system 100 may be calibrated with other testing procedures. Also in other embodiments, integrated circuits may be built with other procedures using data obtained from test system 100. Also in other embodiments, a test system may have a fixture having other configurations.

One embodiment includes a method of characterizing a device under test. The method includes installing a first test board in a fixture. The method also includes installing a device under test in the fixture, performing measurements on the device under test with the first test board installed in the fixture, and removing the first test board from the fixture. The method also includes installing a second test board in the fixture and performing measurements on the device under test with the second test board installed in the fixture.

Another embodiment also includes a method of characterizing a device under test. The method includes installing a first input test board in a fixture and installing a first output test board in a fixture. The method further includes installing a device under test in the fixture, performing measurements on the device under test with the first input test board installed in the fixture and the first output test board installed in the fixture, and removing the first input test board from the fixture. The method further includes removing the first output test board from the fixture, installing a second input test board in a fixture, and installing a second output test board in a fixture. The method further includes performing measurements on the device under test with the second input test board installed in the fixture and the second output test board installed in the fixture.

In another embodiment, a method of testing a device includes installing a first test board in a fixture. The first test board including a first signal path. The method includes installing a device under test in the fixture and performing measurements of the device under test with the first test board and the device under test installed in the fixture. During the performing measurements, the first signal path is coupled between the device under test and a fixture connector to convey signals. The method also includes installing a second test board in a fixture. The second test board includes a second signal path. The method further includes performing measurements of the device under test with the second test board and the device under test installed in the fixture. During the performing measurements, the second signal path is coupled between the device under test and the fixture connector to convey signals.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of characterizing a device under test, the method comprising:
   installing a first test board in a fixture;
   installing a device under test in the fixture;
   performing measurements on the device under test with the first test board installed in the fixture;
   removing the first test board from the fixture;
   installing a second test board in the fixture;
   performing measurements on the device under test with the second test board installed in the fixture.

2. The method of claim 1 wherein the first test board is an input test board and the second test board is an input test board.

3. The method of claim 2 further comprising:
   installing a first output test board in a fixture;
   installing a second output test board in the fixture;
   wherein the performing measurements on the device under test with the first test board installed in the fixture includes performing measurements on the device under test with the first test board installed in the fixture and the first output test board installed in the fixture;
   wherein the performing measurements on the device under test with the second test board installed in the fixture includes performing measurements on the device under test with the second test board installed in the fixture and the second output test board installed in the fixture.

4. The method of claim 3 wherein:
   the first test board is frequency dependent at a first frequency;
   the first output test board is frequency dependent at the first frequency;
   the second test board is frequency dependent at a second frequency, the second frequency is different than the first frequency;
   the second output test board is frequency dependent at the second frequency.

5. The method of claim 1 wherein the first test board is an output test board and the second test board is an output test board.

6. The method of claim 1 wherein:
   the first test board is frequency dependent at a first frequency;
   the second test board is frequency dependent at a second frequency, the second frequency is different than the first frequency.

7. The method of claim 1 wherein:
   the first test board includes a signal path;
   when the first test board is installed in the fixture and the device under test is installed in the fixture, the signal path is coupled to the test device,
   the second test board includes a signal path;
   when the second test board is installed in the fixture and the device under test is installed in the fixture, the signal path is coupled to the device under test.

8. The method of claim 7 wherein:
   the first test board is frequency dependent at a first frequency;
   the second test board is frequency dependent at a second frequency, the second frequency is different than the first frequency;
   the first test board includes a signal path, the signal path includes an impedance transformer, wherein the impedance transformer is a quarter wave length of a fundamental frequency ($f_0$) of the first frequency;
   the second test board includes a signal path, the signal path includes an impedance transformer, wherein the impedance transformer is a quarter wave length of a fundamental frequency ($f_0$) of the second frequency.

9. The method of claim 1 wherein:
   the performing measurements on the device under test with the first test board installed in the fixture further includes measuring S-parameters;
   the performing measurements on the device under test with the second test board installed in the fixture further includes measuring S-parameters.

10. The method of claim 9 wherein:
    the first test board is frequency dependent at a first frequency;
    the second test board is frequency dependent at a second frequency, the second frequency is different than the first frequency;
    the performing measurements on the device under test with the first test board installed in the fixture further includes measuring S-parameters at the first frequency;
    the performing measurements on the device under test with the second test board installed in the fixture further includes measuring S-parameters at the second frequency.

11. The method of claim 1 wherein:
    performing measurements on the device under test with the first test board installed in the fixture further includes performing load pull measurements;
    performing measurements on the device under test with the second test board installed in the fixture further includes performing load pull measurements.

12. The method of claim 11 wherein the performing load pull measurements are performed using a fixed output power algorithm.

13. The method of claim 1 further comprising:
    installing a standard in the fixture;
    performing measurements with the standard and the first test board installed the fixture;
    performing measurements with the standard and the second test board installed the fixture.

14. The method of claim 13 further comprising:
    deriving data from the measurements performed with the standard and the first test board installed the fixture and the measurements performed on the device under test with the first test board installed in the fixture;
    deriving data from the measurements performed with the standard and the second test board installed the fixture and the measurements performed on the device under test with the second test board installed in the fixture.

15. The method of claim 13 wherein the standard is characterized as a golden device.

16. The method of claim 13 wherein the standard is characterized as a zero length through.

17. The method of claim 1 wherein:
    the installing a first test board in the fixture includes inserting a first pin of the first test board into a connector of the fixture;
    the installing a second test board in the fixture includes inserting a second pin of the second test board into the connector of the fixture.

18. The method of claim 1 wherein:
the performing measurements on the device under test with the first test board installed in the fixture produces a first set of data;
the performing measurements on the device under test with the second test board installed in the fixture produces a second set of data;
the method further comprising using the first set of data and the second set of data to design an integrated circuit include a design of the device under test.

19. The method of claim 18 further comprising:
building an integrated circuit using the design of the integrated circuit.

20. The method of claim 1 wherein the device under test is attached to a device carrier, the device carrier is attached to a mid section, wherein installing the device under test includes installing the midsection in the fixture.

21. The method of claim 1 further comprising:
installing a third test board in the fixture;
performing measurements on the device under test with the third test board installed in the fixture.

22. The method of claim 21 wherein the third test board is frequency dependent at a third frequency.

23. A method of characterizing a device under test, the method comprising:
installing a first input test board in a fixture;
installing a first output test board in a fixture;
installing a device under test in the fixture;
performing measurements on the device under test with the first input test board installed in the fixture and the first output test board installed in the fixture;
removing the first input test board from the fixture;
removing the first output test board from the fixture;
installing a second input test board in a fixture;
installing a second output test board in a fixture;
performing measurements on the device under test with the second input test board installed in the fixture and the second output test board installed in the fixture.

24. The method of claim 23 wherein:
the first input test board includes a first signal path, the first signal path is coupled to the device under test when the first input test board and the device under test are installed in the fixture;
the first output test board includes a second signal path, the second signal path is coupled to the device under test when the first output test board and the device under test are installed in the fixture;
the second input test board includes a third signal path, the third signal path is coupled to the device under test when the second input test board and the device under test are installed in the fixture;
the second output test board includes a fourth signal path, the fourth signal path is coupled to the device under test when the second output test board and the device under test are installed in the fixture.

25. The method of claim 24 wherein:
the first input test board and the first output test board are frequency dependent at a first frequency;
the second input test board and the second output test board are frequency dependent at a second frequency, the second frequency is different than the first frequency;
the first signal path includes a first impedance transformer, wherein the first impedance transformer is a quarter wave length of a fundamental frequency ($f_0$) of the first frequency;
the second signal path includes a second impedance transformer, wherein the second impedance transformer is a quarter wave length of the fundamental frequency ($f_0$) of the first frequency;
the third signal path includes a third impedance transformer, wherein the third impedance transformer is a quarter wave length of a fundamental frequency ($f_0$) of the second frequency;
the fourth signal path includes a fourth impedance transformer, wherein the fourth impedance transformer is a quarter wave length of the fundamental frequency ($f_0$) of the second frequency.

26. The method of claim 23 wherein:
the first input test board and the first output test board are frequency dependent at a first frequency;
the second input test board and the second output test board are frequency dependent at a second frequency, the second frequency is different than the first frequency.

27. A method of testing a device, the method comprising:
installing a first test board in a fixture, the first test board including a first signal path;
installing a device under test in the fixture;
performing measurements of the device under test with the first test board and the device under test installed in the fixture, wherein during the performing measurements, the first signal path is coupled between the device under test and a fixture connector to convey signals;
installing a second test board in a fixture, the second test board including a second signal path;
performing measurements of the device under test with the second test board and the device under test installed in the fixture, wherein during the performing measurements, the second signal path is coupled between the device under test and the fixture connector to convey signals.

28. The method of claim 27 wherein:
the performing measurements of the device under test with the first test board and the device under test installed in the fixture further includes measuring S-parameters;
the performing measurements of the device under test with the second test board and the device under test installed in the fixture further includes measuring S-parameters.

29. The method of claim 27 wherein:
the first test board is dependent at a first frequency;
the second test board is dependent at a second frequency, the second frequency is different than the first frequency;
the first signal path includes an impedance transformer, wherein the impedance transformer is a quarter wave length of a fundamental frequency ($f_0$) of the first frequency;
the second signal path includes an impedance transformer, wherein the impedance transformer is a quarter wave length of a fundamental frequency ($f_0$) of the second frequency.

30. The method of claim 27 wherein:
the first test board is dependent at a first frequency;
the second test board is dependent at a second frequency, the second frequency is different than the first frequency.

* * * * *